(12) United States Patent
Chaine et al.

(10) Patent No.: US 8,693,148 B2
(45) Date of Patent: Apr. 8, 2014

(54) OVER-LIMIT ELECTRICAL CONDITION PROTECTION CIRCUITS FOR INTEGRATED CIRCUITS

(75) Inventors: Michael Chaine, Boise, ID (US); Xiaofeng Fan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 732 days.

(21) Appl. No.: 12/350,831

(22) Filed: Jan. 8, 2009

(65) Prior Publication Data

US 2010/0172059 A1    Jul. 8, 2010

(51) Int. Cl.
  *H02H 9/00*    (2006.01)
  *H02H 3/22*    (2006.01)

(52) U.S. Cl.
  USPC .............................................. 361/56; 361/111

(58) Field of Classification Search
  USPC ................... 361/56, 111; 257/355
  See application file for complete search history.

(56) References Cited

U.S. PATENT DOCUMENTS

| | | | |
|---|---|---|---|
| 5,691,213 A | 11/1997 | Chang et al. | |
| 5,793,066 A | 8/1998 | Ajit | |
| 5,895,940 A | 4/1999 | Kim | |
| 6,130,811 A | 10/2000 | Gans et al. | 361/56 |
| 6,218,881 B1 | 4/2001 | Hiraga | |
| 6,492,208 B1 | 12/2002 | Cheng et al. | |
| 6,680,833 B2 * | 1/2004 | Morishita | 361/56 |
| 6,690,557 B2 | 2/2004 | Hung et al. | |
| 6,850,397 B2 * | 2/2005 | Russ et al. | 361/91.8 |
| 7,825,473 B2 | 11/2010 | Ker et al. | |
| 7,869,175 B2 | 1/2011 | Song | |
| 7,910,950 B1 | 3/2011 | Vashchenko et al. | |
| 7,911,749 B2 * | 3/2011 | Lai | 361/56 |
| 2002/0109950 A1 | 8/2002 | Marr | |
| 2003/0107406 A1 | 6/2003 | Li et al. | 326/88 |
| 2004/0100745 A1 * | 5/2004 | Chen et al. | 361/56 |
| 2006/0043487 A1 | 3/2006 | Pauletti et al. | |

(Continued)

FOREIGN PATENT DOCUMENTS

| | | |
|---|---|---|
| KR | 2001-0024361 | 3/2001 |
| KR | 2010-0003569 | 1/2010 |

OTHER PUBLICATIONS

Keppends et al. "*ESD Protection Solutions for High Voltage Technologies*"; EOS/ESD Symposium 04; pp. 289-298.

(Continued)

*Primary Examiner* — Rexford Barnie
*Assistant Examiner* — Christopher Clark
(74) *Attorney, Agent, or Firm* — Dorsey & Whitney LLP

(57) ABSTRACT

Integrated circuits, memories, protection circuits and methods for protecting against an over-limit electrical condition at a node of an integrated circuit. One such protection circuit includes a snapback circuit having at least a portion formed in an isolated doped well region and configured to switch to a low impedance state in response to an input exceeding a trigger condition and further having a control circuit electrically coupled to a reference voltage and further electrically coupled to the isolated doped well region and the portion of the snapback circuit formed in the doped well region. The control circuit includes an impedance adjustable in response to a control signal and configured to adjust an isolated doped well impedance in which at least a portion of the snapback circuit is formed relative to the reference voltage. A modulated trigger and hold condition for the snapback circuit can be set according to a control signal adjusting an electrical impedance of the control circuit.

27 Claims, 8 Drawing Sheets

(56) References Cited

U.S. PATENT DOCUMENTS

| 2006/0091464 | A1  | 5/2006  | Hiraoka |
| 2006/0244071 | A1* | 11/2006 | Kondo ................ 257/355 |
| 2007/0058307 | A1  | 3/2007  | Mergens et al. |
| 2009/0273867 | A1* | 11/2009 | Whitfield et al. ........... 361/56 |
| 2010/0109043 | A1  | 5/2010  | Wang et al. |
| 2012/0170160 | A1  | 7/2012  | Wang et al. |
| 2013/0050886 | A1  | 2/2013  | Fan |
| 2013/0050887 | A1  | 2/2013  | Fan |

OTHER PUBLICATIONS

Mergens et al. "*Biode-Triggered SCR (DTSCR) for RF-ESD Protection of BiCMOS SiGe HBTs and CMOS Ultra-Thin Gate Oxides*"; IEEE 2003; pp. 515-518.

Diks and Pelc "*Broadcasting with Universal Lists*"; Proceedings of the 28$^{th}$ Hawaii International Conference on System Sciences (HICSS 1995); IEEE 1995; pp. 564-573.

Sarro et al. "*Study of Design Factors Affecting Turn-On Time of Silicon Controlled Rectifiers (SCRs) in 90 and 65NM Bulk CMOS Technologies*"; 44$^{th}$ Annual International Reliability Physics Symposium, San Jose, 2006; IEEE; pp. 163-168.

Bruck et al. "*Efficient Algorithms for All-to-All Communications in Multiport Message-Passing Systems*"; IEEE Transactions on Parallel and Distributed Systems, vol. 8, No. 11, Nov. 1997; pp. 1143-1156.

Related U.S. Appl. No. 13/216,147, filed Aug. 23, 2011.

Related U.S. Appl. No. 13/221,777, filed Aug. 30, 2011.

International Search Report for PCT/US2012/051470 dated Mar. 4, 2013.

Written Opinion for PCT/US2012/051470 dated Mar. 4, 2013.

\* cited by examiner

OVER-LIMIT ELECTRICAL CONDITION PROTECTION CIRCUITS FOR INTEGRATED CIRCUITS

TECHNICAL FIELD

Embodiments of the invention relate generally to integrated circuits, and more particularly, in one or more of the illustrated embodiments, to protection circuitry for over-limit electrical conditions that may damage the integrated circuits.

BACKGROUND OF THE INVENTION

Integrated circuits are connectable to "the outside world" through input nodes, output nodes, or input/output nodes such as bond pads, input pads, input/output pins, die terminals, die pads, or contact pads. Buffer circuitry, often configured as an inverter, is interposed between such nodes and active circuitry of the integrated circuit. The buffer circuitry typically includes transistors which should be protected from over-limit electrical conditions, for example, voltages caused by electrostatic discharge (ESD) during handling, testing and operation of the integrated circuit. Subjecting a device to ESD is referred to as an ESD event. An ESD event is an example of an over-limit electrical condition that may cause damage to the circuitry of the integrated circuit unless adequately protected. Typically, an ESD protection circuit, which is well known in the art, is connected to a node, such as a bond pad. One example of an ESD protection circuit includes diodes connecting a bond pad to power rails. The ESD protection circuit protects the transistors from high voltages caused by an ESD event. The ESD protection circuit keeps the potential of the bond pad from exceeding a maximum value.

Although the ESD protection circuit is designed to withstand high current levels, the bond pad potential may be greater than the breakdown voltage of the buffer transistor. This may be especially true for buffer transistors fabricated using current CMOS technologies, in which case the thickness of the gate insulator of the buffer transistor has decreased from the thickness obtained using previous fabrication technologies. As the thickness of the gate insulator decreases, the breakdown voltage of the gate insulator decreases. Consequently, the breakdown voltage of the buffer transistor is often below the potential established on the bond pad by the ESD protection circuit.

As semiconductor technologies have evolved, the standard voltage for representing a logical high signal has been being reduced from an earlier standard of 5 volts to an increasingly common 3.3 volts. For reasons relating to, among other factors, power consumption, thermal performance, speed, and device size, it is entirely possible that the standard voltage for representation of a logical high signal could be reduced even further as semiconductor technologies evolve.

The shift to lower operating voltages in semiconductor devices has not occurred all at once within the semiconductor industry. There has been an ongoing desire for semiconductor devices which are capable of recognizing a range of logical voltages, for example, recognizing either 1.8 volts or 2.5 volts as a logical high signal. Even for semiconductor devices intended to operate only at one operating voltage, however, care must be taken to ensure that the device can withstand an occasional or even sustained overdrive condition without adverse consequences. Those ordinarily skilled in the art will understand that the term "overdrive condition" is used to refer to voltages or currents at an electrical node, such as at an input pad, which exceed specified levels, such as a manufacturer's specification of the "normal" operating parameters for the device. Overdrive conditions can be contrasted with what is typically referred to as a normal operating conditions, that is, conditions specified by a semiconductor device manufacturer to be within specified limits. By way of example, for an input/output pin on a semiconductor device specified for operation with a supply voltage of 3.3 volts, a voltage of greater than five volts present on that pad might be considered an overdrive condition. As known, overdrive conditions may cause over-limit electrical conditions that may damage circuitry.

Typical over-limit electrical condition protection circuits include circuitry that provide a low-impedance conductive path to a reference voltage, such as ground, to dissipate the over-limit electrical condition before operational circuitry of the integrated circuit is damaged. Many of the protection circuits include circuits that exhibit a "snap-back" characteristic. Generally, a snap-back characteristic provides a trigger condition which when exceeded, causes the circuit to enter a low-impedance state. The low-impedance state is maintained while the electrical condition on a node exceeds a hold condition. Examples of conventional circuits having snapback characteristics include thyristors, such as silicon controlled rectifiers (SCRs), and overdriven metal-oxide-semiconductor (MOS) transistors, and diodes.

In designing an adequate protection circuit using a snapback circuit, the trigger condition must be sufficiently low to provide protection before a breakdown condition occurs for operational circuitry. Examples of conventional circuits having set trigger condition, and typically the hold condition as well, include diode-triggered SCRs (DTSCRs). Once set, however, adjusting (e.g. changing, altering, etc.) the trigger condition, however, often requires redesign of the protection circuit. That is, the protection circuits are typically "hard-wired" and are not modified after the integrated circuit is fabricated. Moreover, trigger conditions for ESD protection and protection against latch-up conditions are often different, thus, having a protection circuit having a trigger condition set to protect against one condition may be a compromise for protecting against the other over-limit electrical conditions.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, and timing protocols have not been shown in detail in order to avoid unnecessarily obscuring the invention.

Figure 1:
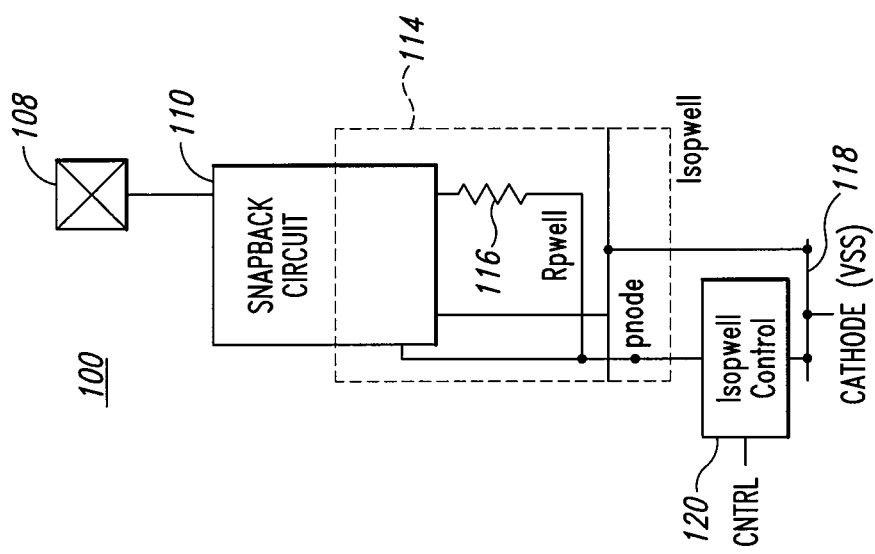
FIG. 1 is a block diagram of an over-limit electrical condition protection circuit according to an embodiment of the present invention.

FIG. 1 illustrates an over-voltage/over-current protection circuit 100 according to an embodiment of the invention. The protection circuit 100 includes a snapback circuit 110 coupled to an anode 108 and a cathode 118. As will be described in more detail below, the snapback circuit 110 provides a low impedance electrical coupling between the anode 108 and cathode 118 upon exceeding a trigger condition. The low impedance electrical coupling allows an over-limit electrical condition applied to the anode 108 to be dissipated through the cathode 108. Over-limit electrical conditions include electrostatic discharge, over-voltage/over-current conditions, and the like.

The anode 108 typically represents an input, input/output, or output node, such as a terminal, of a integrated circuit. The cathode 108 is typically coupled to a reference voltage, such as ground (VSS). The snapback circuit 110 includes at least a portion that is formed in an isolated p-well (isopwell) 114, which will be described in more detail below. The isopwell is formed in a semiconductive material, such as a semiconductor substrate. As used herein, the term semiconductive material, includes a bulk semiconductive region, an epitaxial layer, a doped well region, and the like. FIG. 1 illustrates a parasitic p-well resistance 116 that is inherent with the p-well structure. The protection circuit 100 further includes an isopwell control circuit 120 coupled to the snapback circuit 110. The p-well resistance 116 is also coupled to the isopwell control circuit 120. As will be explained in more detail below, the isopwell control circuit 120 can be used to modulate the performance characteristics of the snapback circuit 110. For example, a trigger condition and a hold condition, as will be described in more detail below, can be adjusted by the isopwell control circuit 120. A control signal CNTRL is applied to the isopwell control circuit 120 to control modulation of the snapback circuit 110.

Figure 2:
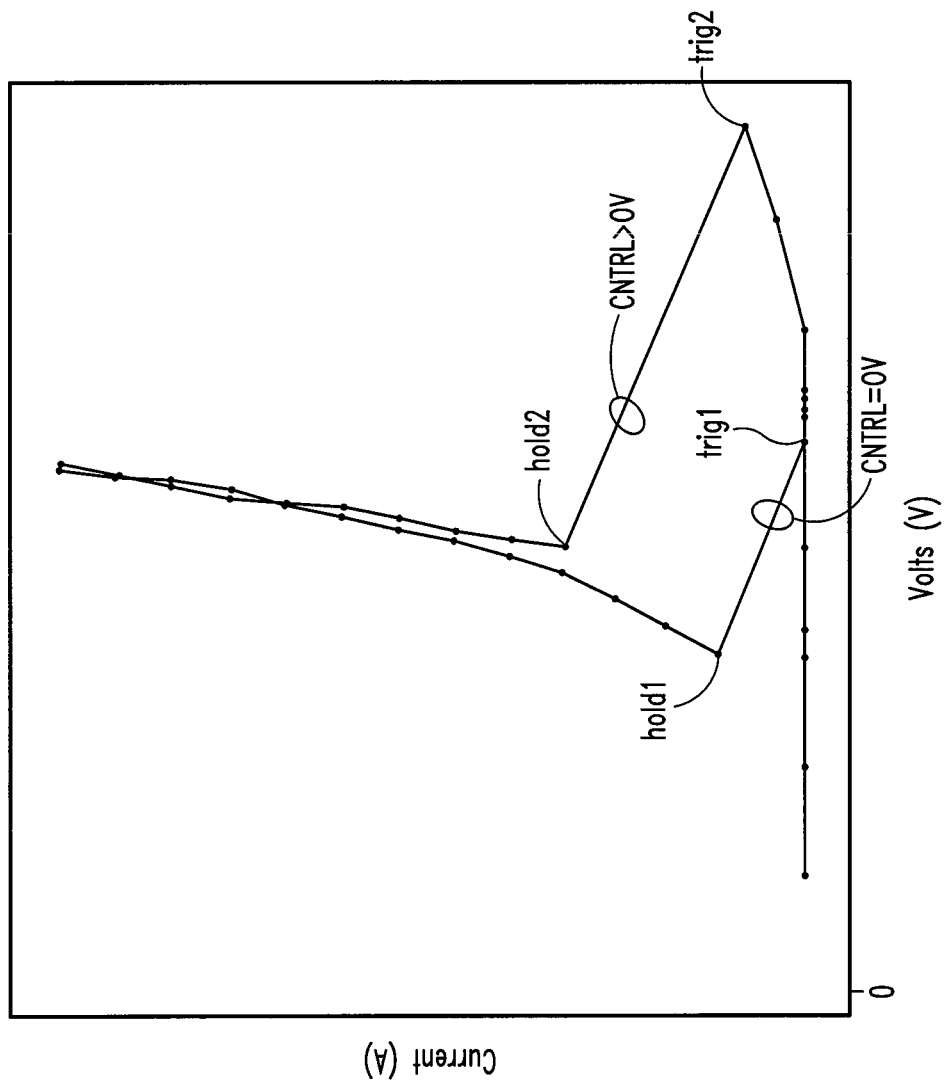
FIG. 2 is a current-voltage diagram of snapback I-V curves for an embodiment of the present invention.

As previously described, the protection circuit 100 includes a snapback circuit 110. The snapback circuit 110 exhibits general current-voltage (I-V) characteristics such as that shown in the I-V curves of FIG. 2. FIG. 2 illustrates the "snapback" characteristics for two conditions of the CNTRL signal applied to an isopwell control circuit, such as that shown in FIG. 1. In particular a first I-V curve is for the condition of CNTRL=0 volts and the second I-V curve is for the condition of CNTRL>0. Each of the I-V curves exhibit a trigger condition, trig1 and trig2, and a hold condition hold1 and hold2. The trigger and hold conditions represent current-voltage conditions to trigger the snapback response and maintain the snapback condition, respectively. Circuits having the general snapback response as illustrated in FIG. 2 are known by those ordinarily skilled in the art. The snapback circuit 110 can be implemented by a conventional snapback circuit or a snapback circuit later developed.

Figure 3A:
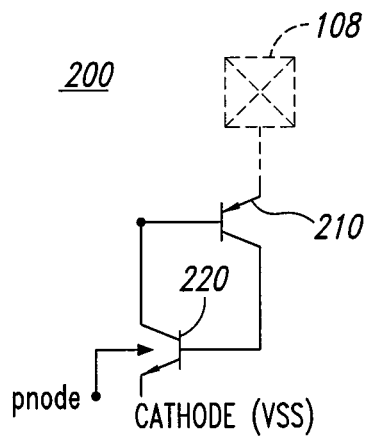
FIG. 3A is a schematic diagram of a snapback circuit according to an embodiment of the invention.
Figure 3B:
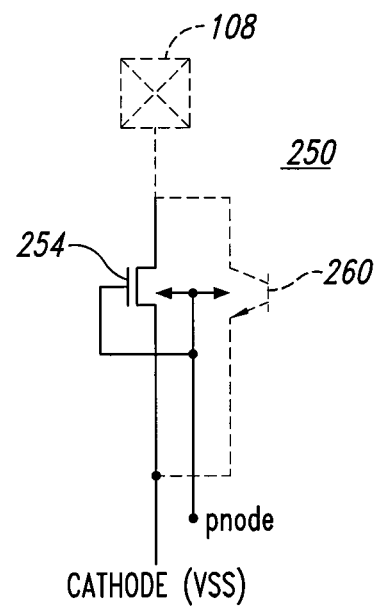
FIG. 3B is a schematic diagram of a snapback circuit according to an embodiment of the invention.

FIGS. 3A and 3B illustrate examples of snapback circuits that may be used for the snapback circuit 110 in different embodiments of the invention. FIG. 3A illustrates a snapback circuit 200, such as thyristor, such as a silicon controlled rectifier (SCR), used in some embodiments of the invention. As known and as illustrated in FIG. 3A, an SCR is formed by a four-layer PNP-NPN bipolar junction transistor (BJT) 210, 220 combination. An example conventional design includes formation of the PNP- and NPN-BJTs 210, 220 in a p+ diffusion in nwell and a n+ diffusion in pwell. In embodiments of the invention utilizing the snapback circuit 200 as the snapback circuit 110, a lateral NPN-BJT 220 can be formed in an isopwell structure, such as the isopwell 114 of FIG. 1. A base region of the NPN-BJT 220 (shown in FIG. 3A as pnode) is coupled to the isopwell control circuit 120. In operation, the snapback circuit 200 is triggered as the base-to-emitter diode of the lateral NPN-BJT 220 is forward biased. Using conventional designs, the forward bias for the base-to-emitter diode may be approximately 0.6 V at room temperature and can occur as the voltage rises in the pwell or isopwell in which the NPN-BJT 220 is formed as leakage current from the PNP-BJT 210 is discharged through the resistance of the pwell or the isopwell resistance 116 (FIG. 1). A base-to-emitter voltage of 0.6 V can be induced when the voltage across the snapback circuit 200 causes a reverse-bias breakdown of the junction between the nwell in which the PNP-BJT 210 is formed and the pwell in which the NPN-BJT 220 is formed. The typical breakdown voltage for the nwell-pwell junction can be approximately 20 V.

FIG. 3B illustrates a snapback circuit 250 used in some embodiments of the invention as the snapback circuit 110. The snapback circuit 250 includes a n-channel transistor 254. An example of a n-channel transistor is a n-channel field-effect transistor (FET). As known, a parasitic lateral NPN-BJT 260 (shown in dashed lines in FIG. 3B) can result from over-biasing the source and drain of the n-channel transistor 254 and provides a snapback response such as that shown in the I-V curves of FIG. 2. The n-channel transistor 254 and resulting NPN-BJT 260 are formed in an isopwell structure, such as isopwell 114 of FIG. 1. A gate and a channel region of the n-channel transistor 254 are coupled to the isopwell control circuit 120.

Figure 4:
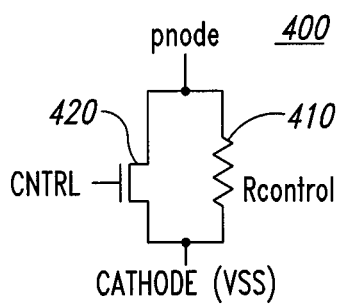
FIG. 4 is a schematic diagram of an isopwell control circuit according to an embodiment of the invention.

FIG. 4 illustrates an isopwell control circuit 400 according to some embodiments of the invention. As previously described with reference to FIG. 1, the isopwell control circuit 120 is used to modulate the snapback performance characteristics of the snapback circuit 110. The isopwell control circuit 400 is an example of an isopwell control circuit that can be used for the snapback circuit 110.

The isopwell control circuit 400 includes an impedance 410 and variable impedance circuit 420 coupled in parallel. Impedance of the variable impedance circuit 420 can be controlled by the CNTRL signal. The impedance 410 is illustrated in FIG. 4 as a resistor Rcontrol and the variable impedance circuit 420 is illustrated as a n-channel transistor. In some embodiments of the invention, the impedance 410 and variable impedance circuit 420 can be implemented using other impedance circuits. In operation, the variable impedance circuit 420 is used to adjust the overall impedance between the pnode, which is coupled to the snapback circuit 110, and the cathode 118 (FIG. 1) in accordance with the CNTRL signal. As a result, the isopwell resistance can be modulated to adjust the snapback performance characteristics of the snapback circuit 110 in response to the CNTRL signal.

For example, in embodiments of the invention utilizing the snapback circuit 200 (FIG. 3A) and the isopwell control circuit 400 (FIG. 4), the CNTRL signal can be modulated to adjust the trigger and hold conditions for the snapback circuit 200. An example of such a change is generally illustrated by the I-V curves of FIG. 2. As applied to the isopwell control circuit 400, under a first condition with CNTRL=0 volts the variable impedance circuit 420 behaves as an open circuit, thereby presenting an added impedance to the isopwell provided by the impedance 410. In some embodiments, the impedance 410 is implemented as a relatively high resistance, for example, 50-100 kohms. The added isopwell impedance provided by the impedance 410 can raise the isopwell resistance 114 (FIG. 1) to the cathode 118 (i.e., ground). As a result, the p-substrate current required to forward bias the base-to-emitter pn-junction can be decreased, thereby decreasing the trigger voltage of the snapback ESD circuit 200. In contrast, if the CNTRL>0 volts and causes the n-channel transistor 420 to become conductive, the overall impedance of the isopwell control circuit 400 will decrease from the impedance provided by impedance 410. As the added impedance of the isopwell control circuit 400 decreases due to the CNTRL signal, the trigger voltage for the snapback circuit 200 increases. In a condition where CNTRL is great enough to cause the n-channel transistor 420 to have a low impedance, for example, around 100 ohms, which results in essentially electrically coupling the isopwell 114 to ground, the snapback circuit 200 will exhibit performance characteristics of an un-modulated SCR circuit.

The I-V curves of FIG. 2 illustrate the general relationship of the snapback circuit 200 (as well as other implementations of snapback circuits) where the CNTRL signal is used to adjust added impedance to the isopwell 114 provided by the isopwell control circuit 120. The I-V curve associated with a CNTRL>0 volts exhibits a greater trigger condition (trig2) as well as a greater hold condition (hold2) relative to the I-V curve associated with a CNTRL=0 volts having trigger condition trig1 and hold condition hold1. The increase in the trigger and hold conditions, as previously explained, results from a decrease in the added impedance to the isopwell impedance 116 provided by the isopwell control circuit 120.

In some embodiments of the invention, the isopwell control circuit 120 is used during power-up of an integrated circuit. For example, when the integrated circuit having an embodiment of the invention is unpowered, the CNTRL signal is nearly 0 volts or less than what is sufficient to reduce the added impedance of the isopwell control circuit 120, which can essentially cause the isopwell-to-cathode (i.e., ground) impedance to be large. As previously discussed, under this condition, the trigger voltage may be lowered for the snapback circuit 110. An advantage to a lowered trigger voltage is that it will provide greater over-voltage/over-current protection to an integrated circuit for an input, input-output, or output node to which the protection circuit 100 is coupled in the event a relatively high-voltage and/or current is applied to the node. That is, less voltage and/or current is necessary to trigger the protection circuit 100 to discharge the over-voltage/over-current. An example of an event that presents relatively high-voltage and/or current to a node is an ESD impulse.

Following power-up of the integrated circuit, the CNTRL signal is adjusted (e.g., increased) to reduce the additional impedance provided by the isopwell control circuit 120. As previously described, the decrease in impedance between the isopwell and the cathode 118 causes an increase to the trigger condition and the hold condition. The increased hold condition increases latch-up immunity of the protection circuit 100. In some embodiments, the CNTRL signal is adjusted to increase the hold condition to approximately two-three times the operating voltage of the integrated circuit. For example, where the operating voltage for an integrated circuit is 1.0 V, the isopwell control circuit 120 is adjusted to provide a hold condition approximately 2.0-3.0 V. As previously described, the CNTRL signal can be adjusted to modulate the performance characteristics of the snapback circuit 110 to provide the desired hold condition.

As described by the previous example, operating the protection circuit 100 through the use of the isopwell control circuit 120 in such a manner can provide both the relatively high voltage requirements to prevent latch-up and the relatively low trigger-current need of ESD protection. In other embodiments, the isopwell control circuit 120 is not operated in a binary-type manner of providing either maximum added impedance or minimum impedance. The isopwell control circuit 120 may be additionally or alternatively adjusted continuously over the range of the available impedance using the CNTRL signal. In this manner, the added impedance, and consequently, the trigger condition for the protection circuit 100, can be adjusted to a desired level within the available range of modulation provided by the isopwell control circuit 120.

Figure 5:
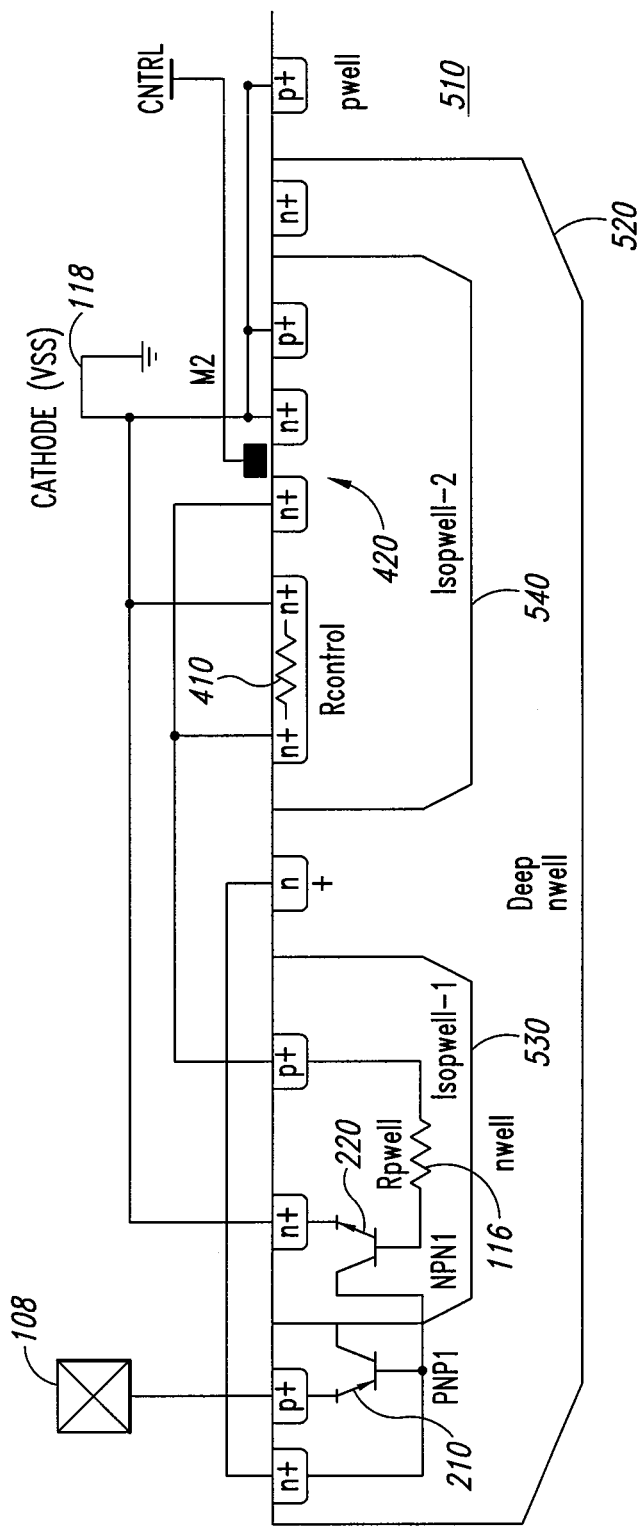
FIG. 5 is a cross-sectional diagram of an integrated circuit according to an embodiment of the invention including a snapback circuit and isopwell control circuit.

FIG. 5 is a cross-sectional drawing for a protection circuit having snapback circuit as shown in FIG. 3A and an isopwell control circuit as shown in FIG. 4 according to an embodiment of the invention. A pwell 510 is formed in a semiconductor material (not shown). A deep nwell 520 is formed in which the PNP-BJT 210 and isopwells 530 and 540 are formed. In the embodiment shown in FIG. 5, two separate isopwells 530, 540 are used. The NPN-BJT 220 of the snapback circuit 200 is formed in the isopwell 530. A parasitic isopwell resistance 116 is also present in the isopwell 530. The isopwell control circuit 400 is formed in the isopwell 540. In alternative embodiments, the isopwell control circuit 120 and at least a portion of the snapback circuit 110 are formed in a common isopwell.

Figure 6:
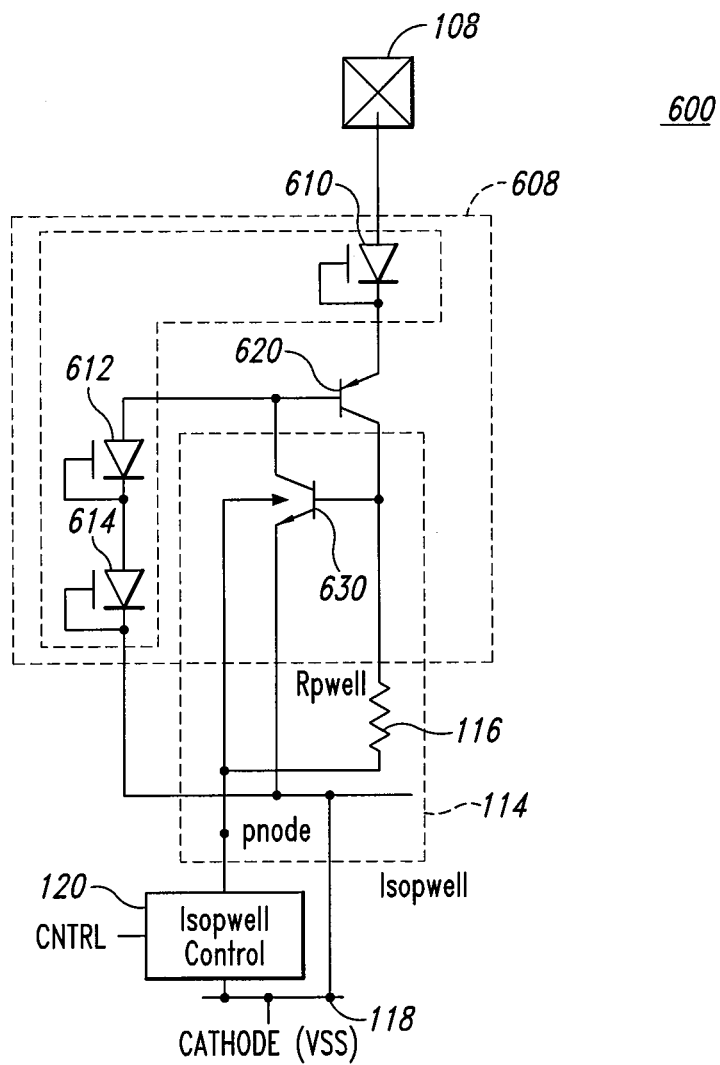
FIG. 6 is a schematic diagram of an over-limit electrical condition protection circuit according to an embodiment of the present invention.

FIG. 6 illustrates an over-voltage/over-current protection circuit 600 according to an embodiment of the invention. The protection circuit 600 includes a snapback circuit 608 that can be used for the snapback circuit 110 of FIG. 1. The snapback circuit 608 is an example of a diode-triggered SCR (DTSCR). The SCR includes PNP-BJT 620 and NPN-BJT 630, which is formed in the isopwell 114. The diodes 610, 612, 614 are coupled to the SCR to set the trigger condition for the SCR. In particular, the diodes 610, 612, 614 set the trigger condition to approximately the sum of the forward bias voltages for the diodes 610, 612, 614 and the emitter-base pn-junction of the PNP-BJT 620. For example, where the forward bias voltage of the diodes 610, 612, 614 are approximately 0.6 V and the forward bias voltage of the emitter-base junction of the PNP-BJT 620 is 0.6 V, the trigger condition for the SCR is approximately 2.4 V. Although included in the protection circuit 600 of FIG. 6, the diodes 610, 612, 614 are optional and in some embodiments of the invention are not included in the protection circuit. As previously discussed, the isopwell control circuit 120 can be used to modulate the trigger conditions of the snapback circuit 608. For example, the CNTRL signal can be used to adjust an isopwell to cathode resistance to increase the trigger conditions from the natural trigger condition of the SCR. Using the particular isopwell control circuit 400 of FIG. 4 as an example, the CNTRL signal can set an added resistance to the isopwell-cathode resistance over the range of Rcontrol to a short-circuit. The isopwell control circuit 120 can replace the diode chain to be the trigger condition control element of the low voltage SCR device, rendering a new type of SCR (or other snapback devices) design.

As previously discussed, when the added resistance of the isopwell control circuit 400 is approximately equal to Rcontrol (i.e., the transistor 420 is non-conductive), the trigger condition for the SCR of the snapback circuit 608 is the low voltage (unmodulated) trigger condition. In contrast, when the added resistance of the isopwell control circuit 400 is zero (i.e., the transistor is fully conductive provided a short-circuit to the cathode 118), the trigger condition for the SCR of the snapback circuit 608 is shifted to a higher voltage/current condition. Similarly, the hold condition for the SCR is also increased. The CNTRL signal can be adjusted so that the isopwell control circuit 400 provide added resistance between Rcontrol and zero to modulate the trigger condition for the DTSCR between the two limits previously described. In some embodiments of the invention, the protection circuit 600 illustrated in FIG. 6 can be fabricated generally having the same structure as previously described with reference to FIG. 5. The example structure illustrated by FIG. 5 can be modified to include the diodes 610, 612, 614. For example, the diodes 610, 612, 614 can be formed and electrically coupled to the anode 108, SCR, and cathode 118 as illustrated in FIG. 6 using convention designs and fabrication techniques.

Figure 7:
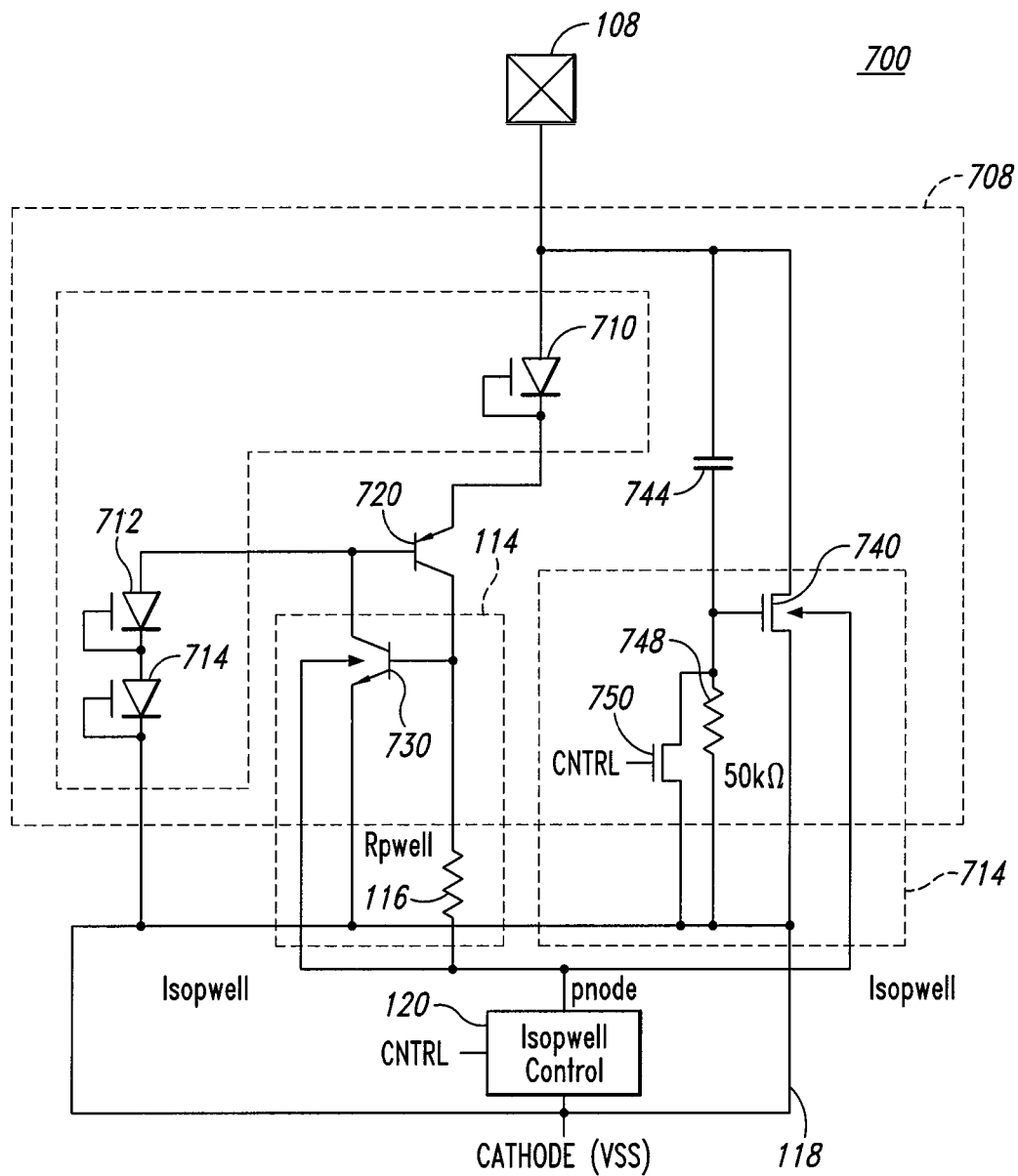
FIG. 7 is a schematic diagram of an over-limit electrical condition protection circuit according to an embodiment of the present invention.

FIG. 7 illustrates an over-voltage/over-current protection circuit 700 according to an embodiment of the invention. The protection circuit 700 includes a snapback circuit 708. The snapback circuit 708 includes a DTSCR having diodes 710, 712, 714 coupled to a SCR having PNP-BJT 720 and NPN-BJT 730. Although included in the protection circuit 700 of FIG. 7, the diodes 710, 712, 714 are optional and in some embodiments of the invention are not included in the protection circuit, that is, the snapback circuit 708 is an SCR without any diode-triggering. The NPN-BJT 730 is formed in an isopwell 114. The snapback circuit 708 further includes n-channel transistor 740 coupled between the anode 108 and cathode 118, and a capacitance, such as capacitor 744 coupled to a n-channel transistor 750 and an impedance 748, between the anode 108 and the cathode 118. A gate of the n-channel transistor 740 is coupled to the capacitor 744. The n-channel transistor 740, impedance 748 and n-channel transistor 750 are formed in an isopwell 714. In some embodiments, the isopwell 714 is a separate isopwell from the isopwell 114 in which the NPN-BJT 730 is formed. In other embodiments, the isopwell 714 is the same isopwell as the isopwell 114. An isopwell control circuit 120 is coupled to a pnode that is in turn coupled to a pwell resistances 116 and a base of the NPN-BJT 730.

The n-channel transistor 740, impedance 748 and n-channel transistor 750 formed in the isopwell 714 provides additional modulation of the trigger condition of the snapback circuit 708. As a result, the snapback circuit 708 provides two trigger conditions that can be modulated, a first trigger condition for the DTSCR and a second trigger condition for the n-channel transistor 740. The n-channel transistor 740 can be adjusted to have a trigger condition that may be less (e.g., lower voltage) than the trigger condition of the DTSCR when the DTSCR has previously triggered and is no longer conductive because the hold condition for the DTSCR is no longer met. The trigger conditions of the DTSCR and the n-channel transistor 740 may also be modulated relative to one another to provide greater flexibility in setting a trigger condition for the snapback circuit 708. The trigger condition for the n-channel transistor 740 can be modulated by using CNTRL to modulate a gate condition as well as modulate a channel condition for the n-channel transistor 740. In particular, the gate condition can be modulated using the transistor 750 and the channel condition can be modulated using the isopwell control circuit 120, as previously described.

Figure 8:
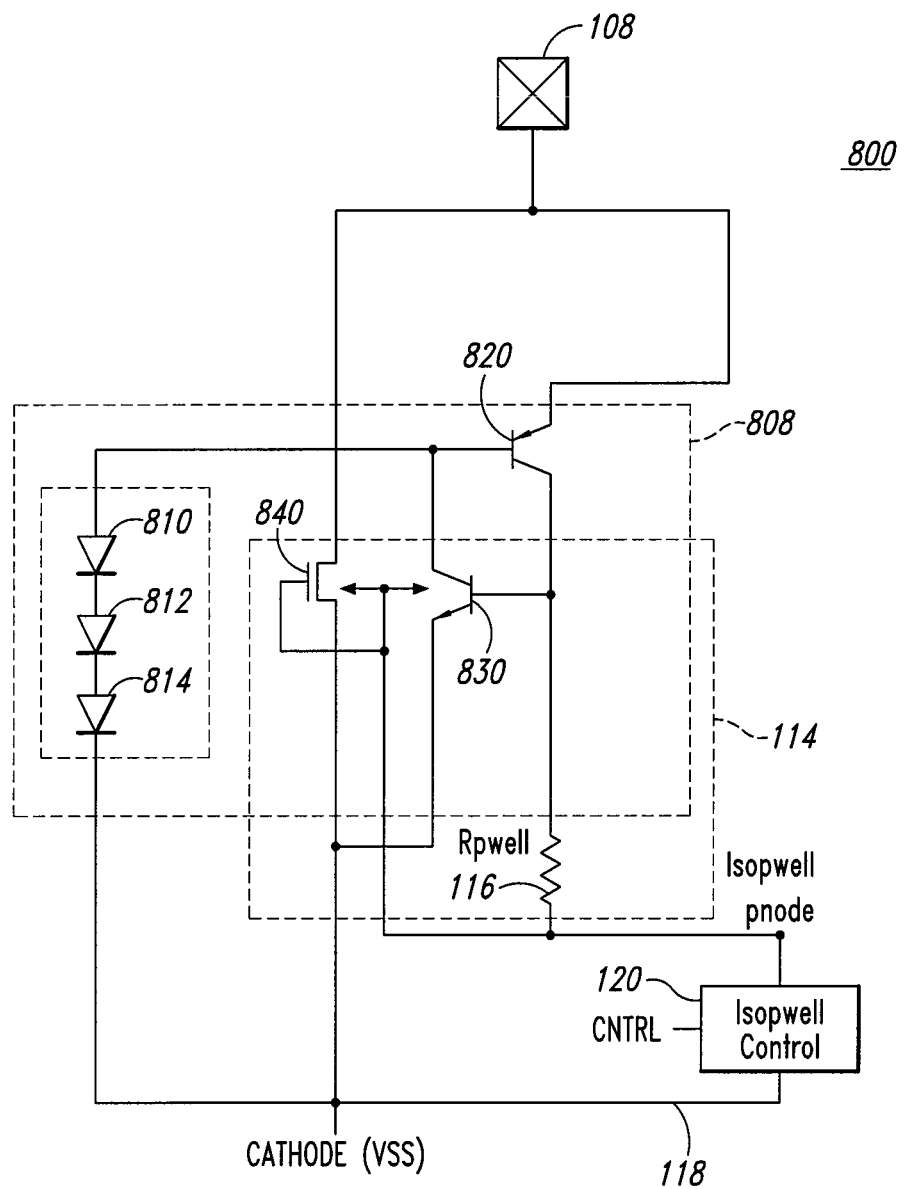
FIG. 8 is a schematic diagram of an over-limit electrical condition protection circuit according to an embodiment of the present invention.

FIG. 8 illustrates an over-voltage/over-current protection circuit 800 according to an embodiment of the invention. The protection circuit 800 includes a snapback circuit 808. The snapback circuit 808 includes a DTSCR having diodes 810, 812, 814 coupled to an SCR having PNP-BJT 820 and NPN-BJT 830. Although included in the protection circuit 800 of FIG. 8, the diodes 810, 812, 814 are optional and in some embodiments of the invention are not included in the protection circuit, that is, the snapback circuit 808 is an SCR without any diode-triggering. The snapback circuit 808 further includes a n-channel transistor 840 coupled to the anode 108 and cathode 118. The NPN-BJT 830 and the n-channel transistor 840 are formed in the isopwell 114. The isopwell control circuit 120 is coupled to the pnode, which is in turn coupled to the channel region of the n-channel transistor 840, the base of the NPN-BJT 830, and the pwell resistance 116.

Similar to the snapback circuit 708 (FIG. 7), the snapback device 808 has two trigger conditions, a first one related to the DTSCR of PNP-BJT 820 and NPN-BJT 830 and a second one related to the n-channel transistor 840. The diodes 810, 820, 830 set a trigger condition for the SCR. The isopwell control circuit 120 can be used to modulate the two trigger conditions of the snapback circuit 808. For example, the CNTRL signal can be used to adjust an isopwell to cathode resistance to increase the trigger conditions from the natural trigger conditions of the DTSCR and the n-channel transistor 840. Using the particular isopwell control circuit 400 of FIG. 4 as an example, the CNTRL signal can set an added resistance to the isopwell-cathode resistance over the range of Rcontrol to a short-circuit. For example, the CNTRL signal can be adjusted so that the isopwell control circuit 400 provide added resistance between Rcontrol and zero to modulate the trigger condition for the DTSCR between the two limits previously described.

Figure 9:
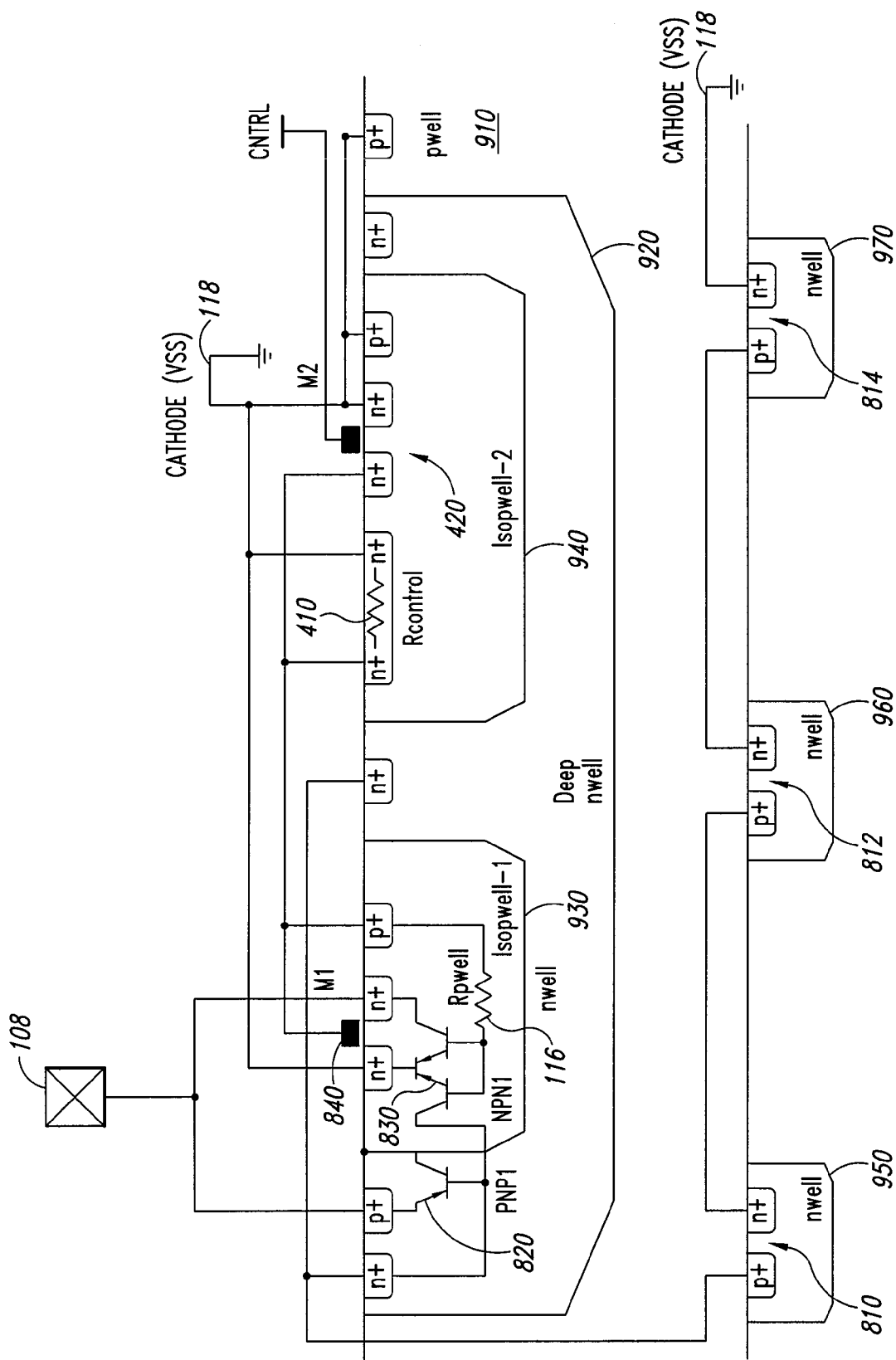
FIG. 9 is a cross-sectional diagram of an integrated circuit according to an embodiment of the invention for the protection circuit of FIG. 8.

FIG. 9 is a cross-sectional drawing for the protection circuit 800 having snapback circuit 808 as shown in FIG. 8 and an isopwell control circuit 400 as shown in FIG. 4 according to an embodiment of the invention. A pwell 910 is formed in a semiconductive material (not shown). A deep nwell 920 is formed in which the PNP-BJT 820 and isopwells 930 and 940 are formed. In the embodiment shown in FIG. 9, two separate isopwells 930, 940 are used. The NPN-BJT 830 of the snapback circuit 808 and the n-channel transistor 840 are formed in the isopwell 930. A parasitic isopwell resistance 116 is also present in the isopwell 930. The isopwell control circuit 400 is formed in the isopwell 940. In alternative embodiments, the isopwell control circuit 120 and at least a portion of the snapback circuit 808 are formed in a common isopwell. Diodes 810, 812, and 814 are formed in respective nwells 950, 960 and 970. Conventional designs and fabrication techniques for integrated circuits can be used to form the structure shown in FIG. 9 and provide the electrical coupling as shown and previously described with reference to FIG. 8.

Figure 10:
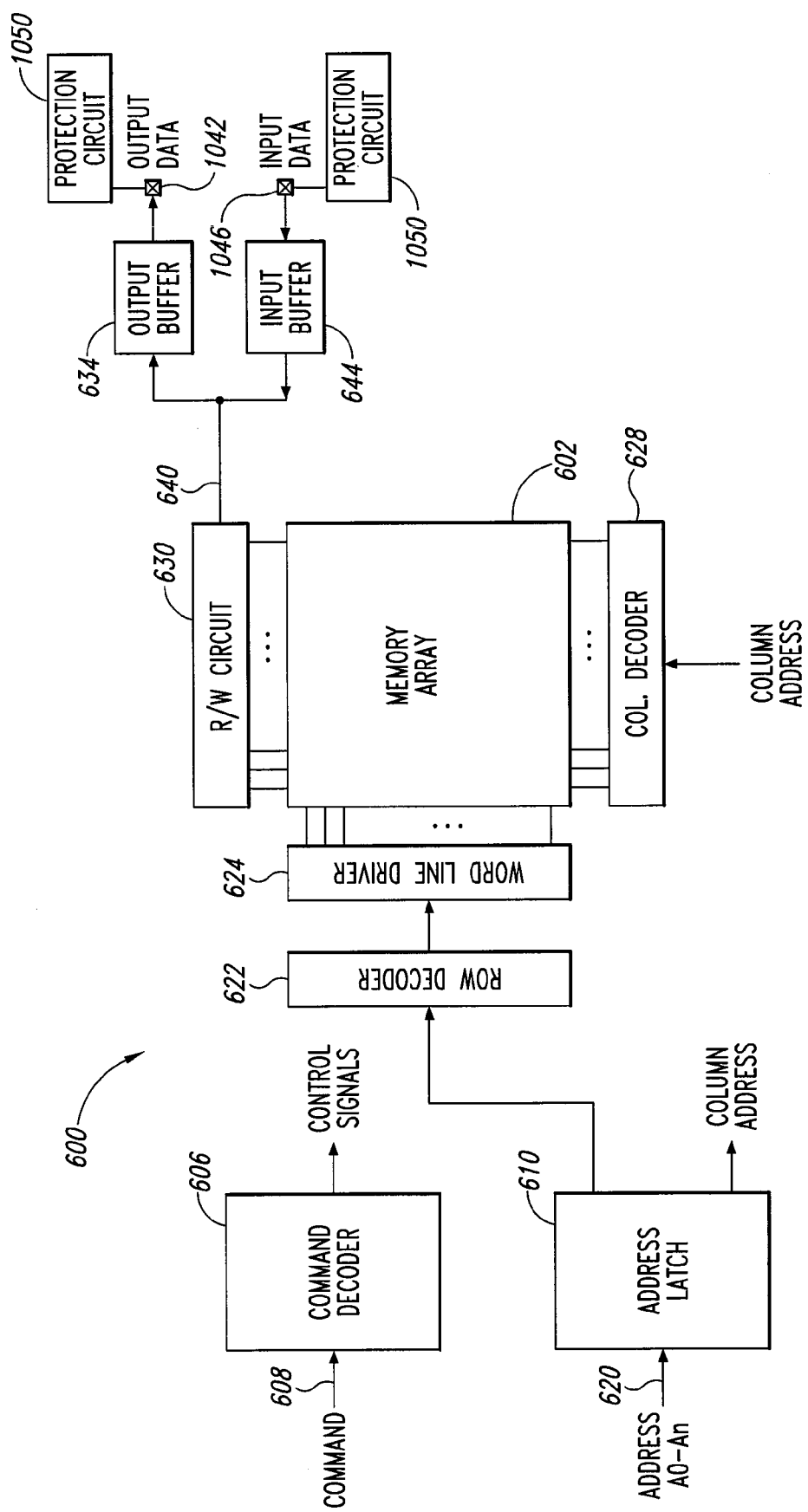
FIG. 10 is a block diagram of a memory system according to an embodiment of the invention having an over-limit electrical condition protection circuit according to an embodiment of the invention.

FIG. 10 illustrates a portion of a memory 1000 according to an embodiment of the present invention. The memory 1000 includes an array 1002 of memory cells, which may be, for example, DRAM memory cells, SRAM memory cells, flash memory cells, or some other types of memory cells. The memory 1000 includes a command decoder 1006 that receives memory commands through a command bus 1008 and generates corresponding control signals within the memory 1000 to carry out various memory operations. Row and column address signals are applied to the memory 1000 through an address bus 1020 and provided to an address latch 1010. The address latch then outputs a separate column address and a separate row address.

The row and column addresses are provided by the address latch 1010 to a row address decoder 1022 and a column address decoder 1028, respectively. The column address decoder 1028 selects bit lines extending through the array 1002 corresponding to respective column addresses. The row address decoder 1022 is connected to word line driver 1024 that activates respective rows of memory cells in the array 1002 corresponding to received row addresses. The selected data line (e.g., a bit line or bit lines) corresponding to a received column address are coupled to a read/write circuitry 1030 to provide read data to a data output buffer 1034 via an input-output data bus 1040. An output pad 1042 coupled to the data output buffer 1034 is used for electrically coupling to the memory 1000. Write data are applied to the memory array 1002 through a data input buffer 1044 and the memory array read/write circuitry 1030. An input pad 1044 coupled to the data input buffer 1042 is used for electrically coupling to the memory 1000. The command decoder 1006 responds to memory commands applied to the command bus 1008 to perform various operations on the memory array 1002. In particular, the command decoder 1006 is used to generate internal control signals to read data from and write data to the memory array 1002.

Over-voltage/over-current protection circuits 1050 according to an embodiment of the present invention are coupled to the output pad 1042 and the input pad 1046. The protections circuits 1050 protect circuitry of the memory 1000 in the event a relatively high-voltage/high-current signal is applied to the output or input pads 1042, 1046. Additionally, as previously discussed, the protections circuits 1050 allow for modulating the trigger conditions and the hold conditions for snapback circuits included in the protection circuits. In some embodiments, the protection circuits can be used in power-up sequences for the memory 1000, as previously discussed. That is, while no power is applied to the memory 1000, the trigger conditions for the protection circuits 1050 are relatively low. In contrast, after power has been applied to the memory 1000, the trigger conditions for the protection circuits 1050 are modulated to a higher trigger condition relative to when no power is applied.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A protection circuit for a node of an integrated circuit, comprising:
    an isolated p-well region formed in a semiconductive material;
    a snapback circuit coupled to the node and including a thyristor and an n-channel transistor, at least a portion of the thyristor being formed in the isolated p-well region; and
    an isolated well control circuit electrically coupled to a reference node and further coupled to the isolated p-well region and the portion of the thyristor formed therein, the isolated well control circuit configured to modulate an impedance between the isolated p-well region and the reference node to modulate a trigger condition and modulate a hold condition of the snapback circuit.

2. The protection circuit of claim 1 wherein the isolated well control circuit is formed in a well region different than the isolated p-well region in which the portion of the thyrister is formed.

3. The protection circuit of claim 1 wherein the isolated p-well region in which the portion of the thyristor is formed and a different well region in which the isolated well control circuit is formed are both formed in a deep well region.

4. The protection circuit of claim 1 wherein the isolated well control circuit comprises:
    a fixed impedance; and
    a variable impedance coupled in parallel with the fixed impedance.

5. The protection circuit of claim 4 wherein a control signal varies the impedance of the variable impedance and an isolated well to reference node impedance is adjusted in accordance with the control signal.

6. The protection circuit of claim 1 wherein the thyristor comprises a silicon controlled rectifier (SCR).

7. The protection circuit of claim 6 wherein the silicon controlled rectifier comprises a diode triggered SCR.

8. The protection circuit of claim 7 wherein the diode triggered SCR comprises at least one diode coupled between the node of the integrated circuit and the SCR.

9. The protection circuit of claim 6 wherein the isolated well control circuit is electrically coupled to a base of a NPN bipolar junction transistor (BJT) of the SCR, the NPN BJT formed in the isolated p-well region.

10. The protection circuit of claim 1 wherein the control circuit is configured to overbias the n-channel transistor to form a parasitic bi-polar junction transistor (BJT) in the isolated p-well region.

11. The protection circuit of claim 10 wherein the isolated well control circuit is electrically coupled to a gate and a channel region of the n-channel transistor.

12. The protection circuit of claim 1 wherein the snapback circuit comprises a circuit configured to provide a low impedance electrical coupling upon exceeding a trigger condition.

13. The protection circuit of claim 1 wherein the isolated well control circuit is configured to control modulation of the snapback circuit.

14. An over-limit protection circuit, comprising:
    a first circuit including a silicon controlled rectifier (SCR) and an n-channel transistor coupled to the SCR, the first circuit having a trigger condition and a hold condition, and further having at least a portion SCR formed in a p-doped well region and configured to switch to a low impedance state in response to an input exceeding the trigger condition; and
    a second circuit electrically coupled to a reference voltage and further electrically coupled to the p-doped well region and the portion of the SCR formed in the p-doped well region, the second circuit having an impedance adjustable in response to a control signal and configured to adjust an impedance between the p-doped well region and the reference voltage, and wherein the second circuit is further configured to adjust the trigger condition and the hold condition of the first circuit.

15. The protection circuit of claim 14 wherein the first circuit comprises a silicon controlled rectifier (SCR) having a PNP bipolar junction transistor (BJT) coupled to a NPN BJT, the NPN BJT formed in the p-doped well region.

16. The protection circuit of claim 14 wherein the
    SCR comprises a PNP BJT coupled to a NPN BJT, the base of the NPN BJT formed in the p-doped well region; and
    the n-channel transistor is coupled to the NPN BJT.

17. The protection circuit of claim 16 wherein the first circuit further comprises a capacitance coupled to a gate of the n-channel transistor.

18. The protection circuit of claim 16 wherein the control signal is further coupled to a gate of the n-channel transistor.

19. The protection circuit of claim 16 wherein a channel region of the n-channel transistor and a base of the NPN BJT are shared.

20. The protection circuit of claim 16 wherein the first circuit further comprises a voltage controlled impedance circuit and a fixed resistance impedance circuit coupled in parallel and further coupled to a gate of the n-channel transistor.

21. The protection circuit of claim 14 wherein the second circuit comprises a voltage controlled impedance circuit and a fixed resistance impedance circuit electrically coupled in parallel between the p-doped well region and the reference voltage.

22. The protection circuit of claim 21 wherein the voltage controlled impedance circuit comprises a n-channel field-effect transistor.

23. The protection circuit of claim 21 wherein the voltage controlled impedance circuit and the fixed resistance impedance circuit are formed in a doped well region different than the p-doped well region in which at least a portion of the SCR is formed.

24. A method for protecting against an over-limit electrical condition at a node of an integrated circuit, the method comprising:
    setting a modulated trigger condition and setting a modulated hold condition for a snapback circuit according to a control signal, the snapback circuit including a silicon controlled rectifier and an n-channel transistor coupled to the silicon controlled rectifier and having an unmodulated trigger condition from which the modulated trigger condition is adjusted and further having an unmodulated hold condition from which the modulated hold condition is adjusted, wherein the modulated trigger condition is set by increasing the electrical impedance between an isolated p-well region in which at least a portion of the silicon controlled rectifier is formed and a reference voltage to increase the unmodulated trigger condition;
    in response to an electrical condition at the node exceeding the modulated trigger condition, providing a low impedance electrical coupling to the reference voltage; and
    maintaining the low impedance electrical coupling in response to the electrical condition at the node exceeding the modulated hold condition.

25. The method of claim 24 wherein providing a low impedance electrical coupling to the reference voltage comprises forward biasing a base-emitter pn-junction of a bipolar junction transistor formed in the isolated p-well region.

26. The method of claim 24 wherein providing a low impedance electrical coupling to the reference voltage comprises providing a parasitic BJT in the isolated p-well region.

27. The method of claim 24 wherein setting a modulated trigger condition for the snapback circuit comprises:
    setting a first modulated trigger condition for the snapback circuit while the integrated circuit does not receive power; and
    setting a second modulated trigger condition for the snapback circuit while the integrated circuit receives power, the second modulated trigger condition relatively greater than the first modulated trigger condition.

* * * * *

UNITED STATES PATENT AND TRADEMARK OFFICE
CERTIFICATE OF CORRECTION

| | | |
|---|---|---|
| PATENT NO. | : 8,693,148 B2 | Page 1 of 1 |
| APPLICATION NO. | : 12/350831 | |
| DATED | : April 8, 2014 | |
| INVENTOR(S) | : Michael Chaine et al. | |

It is certified that error appears in the above-identified patent and that said Letters Patent is hereby corrected as shown below:

In the Claims

In column 10, line 3, in claim 2, delete "thyrister" and insert -- thyristor --, therefor.

In column 10, line 47, in claim 14, delete "portion SCR" and insert -- portion of the SCR --, therefor.

Signed and Sealed this
Twenty-second Day of July, 2014

Michelle K. Lee
*Deputy Director of the United States Patent and Trademark Office*